June 13, 1972 C. J. JACOB ET AL 3,669,734

METHOD OF MAKING ELECTRICAL CONNECTIONS TO A GLASS-ENCAPSULATED SEMICONDUCTOR DEVICE

Filed Aug. 5, 1970

United States Patent Office 3,669,734
Patented June 13, 1972

3,669,734

METHOD OF MAKING ELECTRICAL CONNECTIONS TO A GLASS-ENCAPSULATED SEMICONDUCTOR DEVICE

Charles Junior Jacob, Terre Haute, and Gerald Wayne Lawton, Indianapolis, Ind., assignors to RCA Corporation Filed Aug. 5, 1970, Ser. No. 61,306
Int. Cl. C03c *15/00;* B44d *1/14*
U.S. Cl. 117—217 7 Claims

ABSTRACT OF THE DISCLOSURE

Method of making electrical connections to a glass-encapsulated semiconductor device having aluminum contact pads on a silicon dioxide passivation layer. The method comprises etching away the glass over the contact pads with a solution that etches rapidly but does not attack the aluminum and which contains a soluble compound of a metal having an electrode potential below aluminum in the electrochemical series. The metal compound is present in high enough concentration to deposit on the aluminum surface faster than the etchant can remove it. A thicker layer of solder-wettable metal is then electrolessly deposited on the first metal layer and solder bumps may then be formed on the second metal layer. The second metal layer may be composed of the same metal as the first.

BACKGROUND OF THE INVENTION

Figure 1:
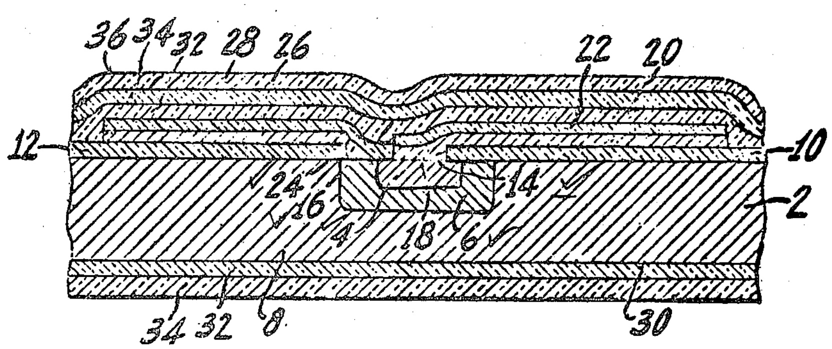

In the manufacture of miniaturized hybrid electronic circuits, a pattern of electrical conductors is deposited on an insulating substrate, usually by screen printing, and various circuit components are attached to the conductors. Active circuit components, such as diodes and transistors, have usually been attached by soldering wire leads to the proper terminal pads of the conductor pattern, but this is a tedious and costly procedure which requires painstaking work by an individual operator. Therefore, methods have been sought which will permit accurate machine placement of these components over the terminal pads and the soldering of all connections in a single heating cycle.

Two solutions to the above component-attaching problem have been found in the so-called "beam lead" and "flip chip" methods. In the latter of these two methods, a type of device is used which has all of its electrode connections on the same surface of the semiconductor chip. These connections are usually aluminum pads on a silicon dioxide passivating layer. Solder bumps are formed on the device where each electrode connection is desired. Similar solder bumps or solderable lands are formed on the contact pads wherever the solder contacts are to be made. The device is "flipped" so that it faces downward and the solder bumps on the device are matched with the solder bumps or solderable lands on the conductor pattern. Then the temperature of the assembly is raised to the melting temperature of the solder so that all connections are soldered at once.

One problem that arises in the "flip chip" method is that of preventing solder from spreading over adjacent parts of the device and circuit and shorting out some of the device electrodes and circuit leads. Another problem is to provide protective hermetic encapsulation for the active devices without adding too much bulk which would increase the difficulty of mounting the device on the conductor pattern on the substrate.

The latter problem has previously been solved by encapsulating the device in a thin layer of glass, such as a low-melting borosilicate glass. Connections must then be made to electrodes beneath the glass layer by removing portions of the layer overlying the electrodes and forming solder bumps as indicated above. This also solves part of the first problem mentioned above since the glass layer prevents spreading of solder to other parts of the device.

Aluminum is presently preferred as the metal for active device contact pads, for various reasons such as ease of evaporation, good electrical conductivity, and lack of adverse effects on the electrical characteristics of transistors and diodes. However, aluminum also presents certain difficulties in mounting devices by the "flip chip" method. One of these is that aluminum rapidly acquires a thin film of oxide when exposed to oxidizing environments such as the atmosphere. The oxide film inhibits the proper deposition of some other metal film on the aluminum surface. Also, aluminum cannot be directly soldered to.

OBJECTS OF THE INVENTION

One object of the present invention is to provide an improved method of making solder connections to aluminum contact pads of semiconductor devices that are encapsulated in glass.

Another object of the invention is to provide an improved method of removing a glass layer from an aluminum surface and depositing a solderable metal on the aluminum such that a layer of oxide on the aluminum does not prevent deposition of the metal.

SUMMARY OF THE INVENTION

The invention is a method of making electrical contact to aluminum contact pads of a glass-encapsulated semiconductor device. The aluminum pads inherently have a coating of aluminum oxide. The methood comprises etching away those portions of the glass layer overlying the pads with a solution of hydrofluoric acid capable of removing the glass layer at a rate of about 100 to 200 A. per second, and containing a substantial amount, up to saturation, of a soluble compound of a metal having an electrode potential below aluminum in the electrochemical series, until the glass overlayer is etched away, the aluminum oxide film is removed, and the metal deposits on the aluminum pad. This metal layer is then covered with a thicker layer of a metal to which solders readily adhere. The second metal may be the same as or different than the first metal. When the device is to be mounted in a hybrid circuit, solder dots are applied to the metal-coated areas.

THE DRAWING

Figure 2:
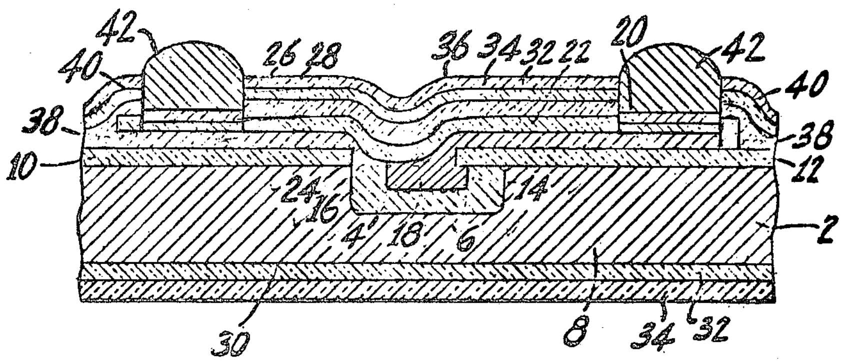

FIG. 1 is a cross-section view of a portion of an encapsulated semiconductor device to which contact is to be made by the method of the present invention, and FIG. 2 is a similar view of a device to which contact has been made.

DESCRIPTION OF PREFERRED EMBODIMENT

In order to be capable of being mounted on a thick-film hybrid circuit by the "flip-chip" method, a transistor must have all of its electrode contacts on the same surface. As shown in FIG. 1, such a transistor may include a silicon body 2, an emitter region 4, a base region 6 and a collector region 8.

The upper surface 10 of the transistor is covered with a silicon dioxide passivation layer 12 except for electrode contact openings such as the emitter contact opening 14, base contact opening 16 and a collector contact opening (not shown).

The emitter opening 14 is provided with an aluminum contact 18 which is extended over part of the silicon dioxide layer 12. Part of the aluminum contact 18 will serve as a bonding pad 20. The aluminum contact 18, including the bonding pad 20, has a very thin layer of aluminum oxide 22 which is always present on an aluminum surface exposed to air or other oxidizing environment.

The base electrode opening 16 is similarly provided with an aluminum contact 24 extending over part of the silicon dioxide layer 12 and including a portion 26 which will serve as a bonding pad. The contact 24 and pad 26 are coated with a thin film 28 of aluminum oxide.

Next, the surface including the aluminum contacts 18 and 24 with their bonding pad portions 20 and 26, respectively, and the aluminum oxide films 22 and 28, is covered with a thin layer of silicon dioxide 32 about 1500 A. thick. This layer also deposits on the under surface 30 of the wafer. This is to protect the aluminum from reaction with the glass layer which is to be applied next.

In order to protect the device from moisture and other atmospheric influences, it is encapsulated in a glass layer 34 about 2.5 to 7 microns thick. The glass may be a borosilicate type glass deposited by passing a mixture of diborane and silane (diluted with argon) over the heated surface of the device wafer. The glass provides good protection against moisture using relatively thin layers. Other types of glass may be used such as lead glasses.

The problem then is how to make solder contact to the aluminum contact pads 20 and 26 without undercutting the encapsulating glass layer 34, without attacking the aluminum to an undesired extent and without going through more steps than necessary, so that cost will not be too high.

It was previously known that the glass over the contact pads could be removed by etching and that a metal which is wettable by solder could be deposited on the aluminum surface. However, these operations were performed as separate steps and it was difficult to prevent aluminum oxide from re-forming on the aluminum, after it had been removed and before the solder-wettable metal was deposited.

In the present method, a second layer of silicon dioxide 36, 1500 A. thick, is first deposited on the glass layer 34 covering the top surface of the device in order to improve the adhesion of the photoresist layer (not shown) which is deposited on the oxide layer 36 and developed in a conventional manner to provide a pattern of openings over the contact pads such as 20 and 26. The photoresist may be any conventional type such as Kmer of Eastman Kodak Co.

Prior to depositing the layer of photoresist, however, the assembly is preferably baked at 250° C. for one hour.

The etching and metal deposition method of the present invention comprises subjecting the exposed glass areas to a solution containing (1) sufficient HF to etch the glass at a rate of about 100 A. to 200 A. per second and (2) a soluble compound of a metal having an electrode potential below that of aluminum in the electrochemical series. The concentration of the metal compound must be high enough to cause metal to be deposited faster than it is being dissolved. A saturated solution is therefore preferred. The purpose of the metal is to etch the aluminum surface and plate it with a particular metal faster than that metal and aluminum are being dissolved. The plated metal is a material to which an additional layer of solder-wettable material can be applied. Examples of solutions capable of etching borosilicate glass, removing the aluminum oxide film from the aluminum surfaces, and simultaneously depositing a suitable metal on the aluminum surface are as follows:

EXAMPLE 1

| | |
|---|---|
| $ZnSO_4\cdot 6H_2O$ | 170 gms./liter. |
| Hydrofluoric acid (48% HF) | 300 ml./liter. |
| Sodium lauryl sulfate (wetting agent) | 5 drops/liter. |

This solution etches through the glass in a few minutes and deposits a thin layer of zinc about 2000 A. thick on the freshly exposed aluminum surface. The etching rate varies with the glass composition used but the endpoint is plainly signalled by the appearance of the dark layer of zinc 38 (FIG. 2). This is quite visible to the operator. The etching rate is chosen such that it will be conducted at an optimum rate without attacking the aluminum to an undesired extent or removing the zinc.

It is next preferable to deposit a thicker layer of nickel 40 (or other solder-wettable metal) on the zinc. This can be done using anyone of many well known electroless nickel plating solutions. An example of a suitable plating bath is the following:

| | |
|---|---|
| $NiSO_4\cdot 6H_2O$ | 10–50 gms./liter of bath. |
| $NaH_2PO_2\cdot H_2O$ | 10–50 gms./liter of bath. |
| $Na_4P_2O_7\cdot 10H_2O$ | 10–100 gms./liter of bath. |
| $NH_4OH$ (58% by wt. ammonia) | 5–40 cc./liter of bath. |

These baths operate at room temperature.

After the nickel is deposited and excess solution removed by rinsing and drying, the unit can be dipped in solder such as that having the composition 95.5% Pb, 3% Sn and 1.5% Ag. Another suitable composition is 60% Pb, 38% Sn and 2% Ag. These solders form bumps 42 about 25 microns high above the dielectric surface of the layer 36 when the diameter of the openings is about 7 mils.

The method has been illustrated as applied to a single transistor but it is usually applied to hundreds of transistors on a single semiconductor wafer. After all of the above fabrication steps have been completed, the devices are separated by sawing. Individual devices may then be mounted on a hybrid circuit by placing them face down so that the solder bumps 42 match solderable lands or other solder bumps on circuit terminals. The unit is then heated to melt the solder.

An example of another etching and plating solution that can be used in the method of the present invention is as follows:

| | |
|---|---|
| Glycerol | 500 ml./liter. |
| Hydrofluoric acid (48% HF) | 500 ml./liter. |
| $ZnSO_4\cdot 6H_2O$ | 100 gms./liter. |
| $NiSO_4\cdot 6H_2O$ | 10 gms./liter. |
| $TiCl_4$ | .05 gm./liter. |

This solution has an etch rate of 286 A./sec. on the same borosilicate glass mentioned above. After depositing zinc it also deposits a thin film of nickel but more nickel must be deposited before applying solder.

EXAMPLE 3

Another etching and plating solution that can be used to deposit platinum instead of zinc is:

| | |
|---|---|
| Hydrofluoric acid (48% HF) | 300 ml./liter. |
| Potassium platinic chloride | 1 gm./liter. |

The remainder of the solution is water.

EXAMPLE 4

The following solution deposits palladium:

| | |
|---|---|
| Hydrofluoric acid (48% HF) | 300 ml./liter. |
| $PdCl_2$ | 1.5 gms./liter. |

The remainder of the solution is water.

EXAMPLE 5

This solution deposits gold on aluminum:

| | |
|---|---|
| Hydrofluoric acid (48% HF) | 300 ml./liter. |
| $AuCl_3$ | 0.5 gm./liter. |

The remainder of the solution is water.

Other metals which can be included in the etching solution to replace the film of aluminum oxide and provide a base for a thicker layer of solder-wettable metal are: tin, copper, chromium, iron, cadmium, cobalt, lead, antimony and silver.

The thick metal layer can be composed of any solder-wettable metal which can be readily electrolessly deposited. Such metals include copper, gold, iron, palladium and platinum in addition to the nickel previously mentioned.

What is claimed is:

1. A method of making electrical connections to a semiconductor device which has aluminum contact pads having a coating of aluminum oxide and which is encapsulated in glass, the method comprising subjecting the portion of said glass overlying said pads to a composition comprising hydrofluoric acid in a concentration sufficient to remove about 100 A. to 200 A. thickness of said glass per second and a soluble compound of a metal having an electrode potential below aluminum in the electrochemical series until said glass is etched away, said oxide is dissolved and a thin coating of metal deposits from said soluble compound of a metal directly on said aluminum, and then depositing on said coating of metal a second coating of a metal to which solder readily adheres.

2. A method according to claim 1 in which said glass is a borosilicate glass and said soluble compound of a metal is a zinc compound.

3. A method according to claim 2 in which said second metal coating is nickel.

4. A method according to claim 1 in which said soluble compound of a metal is a platinum compound.

5. A method according to claim 1 in which said soluble compound of a metal is a palladium compound.

6. A method according to claim 1 in which said soluble compound of a metal is a gold compound.

7. A method according to claim 1 in which solder is applied to said second coating of metal coating.

References Cited

UNITED STATES PATENTS

| | | | |
|---|---|---|---|
| 3,471,291 | 10/1969 | Schaefer | 156—4 |
| 3,495,324 | 2/1970 | Guthrie | 317—234 M |
| 3,523,038 | 4/1970 | Sanders | 117—217 |

RALPH S. KENDALL, Primary Examiner

C. K. WEIFFENBACH, Assistant Examiner

U.S. Cl. X.R.

29—590; 117—227; 156—4; 252—79.3